（12）United States Patent
Machi et al.

(10) Patent No.: US 7,417,425 B2
(45) Date of Patent: Aug. 26, 2008

(54) CONTINUOUS OBSERVATION APPARATUS AND METHOD OF MAGNETIC FLUX DISTRIBUTION

(75) Inventors: Takato Machi, Tokyo (JP); Noriko Chikumoto, Tokyo (JP); Koichi Nakao, Tokyo (JP); Hiroshi Fuji, Tokyo (JP); Yutaka Kitoh, Tokyo (JP); Teruo Izumi, Tokyo (JP); Yuh Shiohara, Chigasaki (JP)

(73) Assignees: International Superconductivity Technology Center, the Juridical foundation, Tokyo (JP); Fujikura Ltd., Tokyo (JP)

( * ) Notice: Subject to any disclaimer, the term of this patent is extended or adjusted under 35 U.S.C. 154(b) by 39 days.

(21) Appl. No.: 11/514,883

(22) Filed: Sep. 5, 2006

(65) Prior Publication Data

US 2007/0108974 A1    May 17, 2007

(30) Foreign Application Priority Data

Sep. 6, 2005    (JP)    ............................ P2005-258291

(51) Int. Cl.
*G01N 27/82* (2006.01)
*G01R 33/032* (2006.01)

(52) U.S. Cl. ...................... 324/261; 324/224; 324/244.1

(58) Field of Classification Search ................. 324/224, 324/228, 260–262, 244.1; 365/162
See application file for complete search history.

(56) References Cited

U.S. PATENT DOCUMENTS 3,976,934 A * 8/1976 Voigt et al. ................... 324/224

4,132,949 A * 1/1979 Rupp .......................... 324/224
2006/0103380 A1* 5/2006 Kochergin et al. ........ 324/244.1

FOREIGN PATENT DOCUMENTS

JP    03-267782 A    11/1997

OTHER PUBLICATIONS

P. Kovac et al., Comparison and Analysis of Hall Probe Scanning, Magneto-Optical Imaging and Magnetic Knife Measurements of BI-2223/AG Tape, Institute of Physics Publishing, Supercond. Sci. Tech. 18 (2005), 805-812.*
W. Prusseit et al., Identification of Defect Signatures in Coated Conductors by Continuous Hall Probe Scans, presentation document CCA 2004, Japan, Nov. 20, 2004.*
Paasi et al., Homogeneity Studies of Multifilamentary BSCCO Tapes by Three-Axis Hall Sensor Magnetometry, IEEE Transactions on Applied Superconductivity, vol. 9, No. 2 Jun. 1999, pp. 1598-1601.*
Donet et al., Reel-to-Reel MOCUD for YBCO Coated Conductor, IEEE Transactions on Applied Superconductivity, vol. 13, No. 2, Jun. 2003.*
Furtner et al., "Reel-to-Reel Critical Current Measurement of Coated Conductors", Superconductor Science and Technology, vol. 17, pp. S281-S284, 2004, United Kingdom.

* cited by examiner

*Primary Examiner*—Reena Aurora
*Assistant Examiner*—Kenneth J Whittington
(74) *Attorney, Agent, or Firm*—Sughrue Mion, PLLC

(57) ABSTRACT

A continuous observation apparatus of magnetic flux distribution in which a long sample containing a superconducting material or magnetic material is transferred to an observation position and magnetic flux is observed sequentially at each of certain areas along a longitudinal direction of the sample is provided. A method of continuously observing magnetic flux by which a long sample containing a superconducting material or magnetic material is transferred to an observation position and magnetic flux is observed sequentially at each of certain areas along a longitudinal direction of the sample is also provided.

11 Claims, 7 Drawing Sheets

CONTINUOUS OBSERVATION APPARATUS AND METHOD OF MAGNETIC FLUX DISTRIBUTION

BACKGROUND OF THE INVENTION

1. Field of the Invention

The present invention relates to a continuous observation apparatus and method of magnetic flux distribution. More particularly, the invention relates to a continuous observation apparatus and method of magnetic flux distribution such as that for a non-destructive characterization on defects of long superconducting wires and tapes used in power cables, magnets and apparatuses such as motors and generators or that for assessing critical current density or long magnetic tapes.

Priority is claimed on Japanese Patent Application No. 2005-258291, filed Sep. 6, 2005, the content of which is incorporated herein by reference.

2. Description of the Related Art

Where there are defects such as micro cracks or existence of secondary phases and etc. inside a superconducting material, it is conventionally known that a weak coupling region will allow an external magnetic flux to penetrate into the superconducting material, resulting in deteriorated performance of superconductivity. Therefore, it has been strongly demanded to provide a characterization method for detecting whether magnetic properties of the superconducting material are abnormal or not in a non-destructive manner.

Japanese Published Unexamined Patent Application No. H03-267782 has disclosed an apparatus for magnetically detecting inner weak coupling regions of a superconducting material in which a magnetic thin film having a striped magnetic domain structure, in which the direction of spontaneous magnetization is perpendicular to the film surface, is firmly attached to the surface of a superconducting material, the polarized angle of incident light is rotated by the interaction between light and magnetization, and magneto-optical effects are utilized to determine the magnetic flux density distribution based on the width of a magnetic domain pattern observed on the surface of the superconducting material.

Furtner et al. (Reel-to-reel critical current measurement of coated conductors, *Superconductor Science and Technology*, Vol. 17, pp. S281-S284, 2004, United Kingdom) has described an apparatus in which a long superconducting wire of 10 mm in width and 20 cm to 20 m in length is extended between two reels, an intermediate portion is submerged together with a Hall sensor devices array into a liquid nitrogen vessel to cool, and the superconducting wire is continuously transferred between the reels at a speed of 10 mm/second to scan the surface of the superconducting wire in a non-contact manner, thereby measuring the critical current distribution in the magnetic field from the Hall sensor devices array.

However, the above-described conventional magnetic flux observing apparatus has the following problems.

In the technique disclosed in Japanese Published Unexamined Patent Application No. H03-267782, since measurement is made by placing a magnetic thin film-on the surface of a superconducting material, a non-destructive characterization may be performed but no procedure is provided for making an efficient measurement of long samples. The technique has another problem in that because the indicator film of magneto-optical imaging with perpendicular to film surface has magnetic domain patterns, a complicated image processing for calculating the width of a magnetic domain is required in effecting conversion to the magnetic flux density distribution and a longer time is required in making one measurement resulting in failure of carrying out an efficient continuous and speedy measurement of long samples.

Further, another problem is that the measurement resolution will depend on the spacing width of a magnetic domain due to the use of a perpendicular magnetic film. For example, in high-Tc superconducting wires, the resolution will vary in the range from 10 μm to several millimeters. Here, spatial resolution will reduce with increasing external magnetic field. Because the spacing width of magnetic domain increases in higher magnetic field, it is difficult to detect a small size defect, that is to say weak coupling regions, which are smaller than several millimeters.

In the technique of Furtner et al., since a sample is subjected to scanning with a Hall sensor devices array, a continuous non-destructive test may be performed. However, the measurement resolution depends on the arrayed spacing of Hall sensor devices, thereby resulting in the order of several millimeters.

Further, if the same technique described in the above paper reported by Furtner et al. is used to observe magneto-optical images, the apparatus is placed inside a liquid nitrogen vessel to observe light through the liquid nitrogen, thereby making it difficult to obtain clear images and make a highly accurate observation, and therein exists another problem to be solved.

The present invention has been made in view of the above described problems, an object of which is to provide a continuous observation apparatus and method of magnetic flux distribution capable of observing an efficient and continuous measurement of the magnetic flux density distribution in the longitudinal direction at a fixed temperature, even when a sample is made of long superconducting materials.

As for the magnetic tapes, for example magnetic recording tapes such as a main medium in a flight recorder, there is no method to detect the two dimensional information from the magnetic tapes with non-destructive way.

SUMMARY OF THE INVENTION

In order to solve the above problems, a first aspect of the present invention is continuous observation of magnetic flux distribution in which a long sample containing a superconducting material or magnetic recording medium is transferred to an observation position and magnetic flux is observed sequentially at each of certain areas along a longitudinal direction of the sample, comprising: a sample transferring device for intermittently transferring the sample to the observation position; a sample cooling/retaining portion for adjusting the sample transferred to the observation position to a fixed temperature and retaining said temperature; a magnetic field generating portion for generating the magnetic field in a direction perpendicular to the sample surface at the observation position; a magneto-optical indicator film which converts magnetic flux density distribution to polarization distribution of reflected light by magneto-optical effects; a magneto-optical indicator film retaining portion at which the magneto-optical indicator film is synchronized with the transferring action by the sample transferring device so as to be detachable from the surface of the sample; an illumination optical system for being incident linearly-polarized light to the magneto-optical indicator film; a polarization observing device for observing the polarization distribution of reflected light from the magneto-optical indicator film by the illumination optical system; and a cooling mechanism for controlling temperatures at the sample cooling/retaining portion, thereby providing the sample with the fixed temperature at the observation position.

According to this invention, a sample containing a superconducting material or magnetic material is transferred intermittently by the sample transferring device and halted at the observation position on the sample cooling/retaining portion. Here, the sample is cooled to a certain temperature via the sample cooling/retaining portion by temperature control of the cooling mechanism. Then, at the magneto-optical indicator film retaining portion, the in-plane magnetized magneto-optical indicator film having the axis of easy magnetization inside the plane of the film or the paramagnetic magneto-optical indicator film with non-existence of the axis of easy magnetization is attached to or detached from the surface of the sample. In either of these magneto-optical indicator films, since the polarization direction of linearly-polarized light was incident to the magneto-optical indicator film is rotated according to perpendicular components of the magnetic field generated by magneto-optical effects at the magnetic field generating portion, linearly-polarized light enters by the illumination optical system to provide the polarization distribution corresponding to the magnetic flux density distribution. The polarization distribution is observed by the polarization observing device, such as CCD camera. After completion of the observation, the magneto-optical indicator film retaining portion is apart from the sample, the sample transferring device is used to transfer a sample located at an adjacent unobserved area to the observation position, and the above procedures are repeated. Thereby, it is possible to observe sequentially and continuously the magnetic flux density distribution on the surface of the sample along the longitudinal direction at a fixed temperature in certain magnetic fields.

The rotation angle of magneto-optical indicator film (in-plane magnetized magneto-optical indicator film or paramagnetic magneto-optical indicator film) is changed by the Faraday effect, depending on the magnetic flux density in the perpendicular direction. Because a polarizer is used for a detector, the brightness of the reflected light is proportional to the magnetic flux density at any position. Therefore, it is possible to observe the magnetic flux density higher in resolution than a case where the perpendicular magnetic film is measured for the magnitude of a magnetic domain, for example.

Further, since the cooling procedure is used to give temperature control to a sample at the cooling/retaining portion, it is possible to efficiently control temperatures at an observation area and also provide a more stable temperature control at a shorter time than a case where a whole sample is controlled for temperature.

Here, for example, a polarizing microscope may be used as a polarization observing device, by which the polarization distribution corresponding to the magnetic flux density distribution is observed as a contrasting density image having brightness distribution according to the magnetic flux density.

A second aspect of the present invention is the above-described continuous observation apparatus of magnetic flux distribution, in which the cooling procedure may comprise a front-end cooling portion and a rear-end cooling portion at the upstream side and at the downstream side in the transfer direction with respect to the sample cooling/retaining portion for respectively cooling the sample to temperatures lower than the above-described fixed temperature.

According to the invention, the front-end cooling portion and the rear-end cooling portion arranged respectively at the upstream side and downstream side of the sample cooling/retaining portion are used to cool a sample to temperatures lower than the fixed temperature at the sample cooling/retaining portion, thereby making it possible to block the influence of thermal conduction externally through the sample. It is, therefore, possible to provide a stable temperature control at the sample cooling/retaining portion.

Further, since a temperature elevating device is used to perform the temperature control at the sample cooling/retaining portion, the temperature can be promptly controlled by using a simple component, for example, a heater.

In addition, a sample is cooled to temperatures lower than those on observation area at the upstream side of the observation position, and the sample is in advance cooled in a zero magnetic field. Therefore, the sample is less likely to be influenced by magnetic flux penetration due to the magnetic field from the front-end cooling portion to the observation position, thereby eliminating the influence of cooling in the magnetic field.

A third aspect of the present invention is the above-described continuous observation apparatus of magnetic flux distribution, in which the polarization observing detector may comprise an image capturing portion for imaging as brightness distribution of the magneto-optical indicator film; and a data converting portion for converting data on as brightness distribution obtained by the image capturing portion to data on magnetic flux density distribution by using calibration data.

According to the invention, the data on brightness distribution obtained by the image capturing portion are converted to the data on-magnetic flux density distribution by the data converting portion, thereby making it possible to analyze defects of a sample at high accuracy at least the picture element number of data capturing device by image processing of these data on magnetic flux density distribution.

A fourth aspect of the present invention is the above-described described continuous observation apparatus of magnetic flux distribution in which a current distribution property may be calculated based on the data on magnetic flux density distribution obtained by a data converting portion.

According to the invention, it is possible to calculate the current distribution having a high resolution from the data on magnetic flux density distribution by using Ampere law.

Here, the current distribution property may include equal current distribution, current density distribution, critical current density distribution, and other current distribution properties.

A fifth aspect of the present invention is the above-continuous observation apparatus of magnetic flux distribution in which the magnetic field generating portion may comprise a solenoid or pancake magnet, the center of the observation position of the sample is on the central axis of the magnetic field of the solenoid or pancake magnet and arranged distant from the end of the solenoid or pancake magnet, and the front-end cooling portion may be arranged distant toward the outside from the radial end of the solenoid magnet.

According to the invention, the center of the observation position of the sample is on the central axis of the magnetic field of the solenoid or pancake magnet and arranged distant from the end of the coil, and the front-end cooling portion is arranged distant toward the outside from the radial end of the coil. Therefore, a transfer path from the front-end cooling portion to the observation position is designed to be distant respectively from the radial end and the upper end of the coil. Thereby, unlike the case where a sample cooling/retaining portion is arranged inside the solenoid or pancake magnet so that a sample moves through a coil portion of the coil, magnetic field of an area having an increasing magnetic field at an adjacent portion to the coil end is never applied to an area before observation. As a result, it is possible to prevent a case where a magnetic field higher than that to be observed is applied to the sample at higher temperature state.

A sixth aspect of the present invention is the above-described continuous observation apparatus of magnetic flux distribution in which the front-end cooling portion, the rear-end cooling portion, and the sample cooling/retaining portion may be subjected to conduction cooling by the cooling mechanism.

According to the invention, since the front-end cooling portion, the rear-end cooling portion and the sample cooling/retaining portion are subjected to conduction cooling by the cooling mechanism, an observation can be made easily for a longer time than a case where a freezing mixture is supplied to effect cooling.

A seventh aspect of the present invention is the above-described continuous observation apparatus of magnetic flux distribution in which the magneto-optical indicator film may be an in-plane magnetized magneto-optical indicator film having an axis of easy magnetization along the surface of the film.

An eighth aspect of the present invention is the above-described continuous observation apparatus of magnetic flux distribution in which the magneto-optical indicator film may be a paramagnetic magneto-optical indicator film with non-existence of an axis of easy magnetization.

A ninth aspect of the present invention is a method of continuous observation method of magnetic flux distribution by which a long sample containing a superconducting or magnetic material is transferred to an observation position and magnetic flux is observed sequentially at each of certain areas along a longitudinal direction of the sample, comprising: cooling the sample to a first temperature on an upstream side of the observation position; allowing a magnetic field to act on the perpendicular direction of the sample surface in a state such that the sample transferred to the observation position is elevated to a second temperature, which is higher than the first temperature; observing an image of magnetic flux density distribution on the surface of the sample by means of a magneto-optical indicator film which converts magnetic flux density distribution to polarization distribution of reflected light by magneto-optical effects; and cooling the sample to a third temperature which is lower than the second temperature on a downstream side of the observation position and then transferring the sample further downstream.

According to the invention, a long sample is kept at the first and the third temperatures which are lower than the second temperature on observation at the upper stream and the down stream of the observation position, thereby making it possible to block the influence of thermal conduction externally through the sample. It is, therefore, possible to give the sample at the observation position a stable temperature control to the second temperature.

Further, since the temperature control for the second temperature is to elevate temperatures, it is possible to provide a more prompt temperature control by using a simple mechanism such as a heater.

Still further, since a sample is cooled to the first temperature, which is lower than the second temperature, at the upstream side of the observation position, the sample is less likely to be influenced by magnetic flux penetration due to the magnetic field therefrom to the observation position, thereby reducing noise on observation.

Here, the first temperature may be different from the third temperature. It is, however, preferable that they are the same in view of having a common cooling source.

A tenth aspect of the present invention is the above-described continuous observation method of magnetic flux distribution in which the magneto-optical indicator film may be an in-plane magnetized magneto-optical indicator film having an axis of easy magnetization along the surface of the film.

An eleventh aspect of the present invention is the above-described continuous observation method of magnetic flux distribution in which the magneto-optical indicator film may be a paramagnetic magneto-optical indicator film with non-existence of an axis of easy magnetization.

According to the continuous observation apparatus of magnetic flux distribution of the present invention, an effect is obtained such that a sample is transferred intermittently and an observation is made with the temperature equilibrated for each of the certain areas on the sample cooling/retaining portion controlled at a fixed temperature by the cooling mechanism, thereby even a long sample can be efficiently measured by using a magneto-optical indicator film.

According to the continuous observation method of magnetic flux distribution of the present invention, an effect is obtained such that a sample transferred to the observation position is kept lower in temperature than that at the observation position and less likely to be influenced by the magnetic flux penetration before arrival at the observation position, thereby making it possible to increase measurement accuracy, and also a reduced influence of heat transmitted externally via a long sample leads to a stable temperature control of the sample at the observation position and increases measurement efficiency.

DETAILED DESCRIPTION OF THE INVENTION

Hereinafter, an explanation will be made of an embodiment of the present invention by referring to the attached drawings.

Then, an explanation will be made of continuous observation apparatus of magnetic flux distribution to the embodiment of the present invention.

Figure 1:
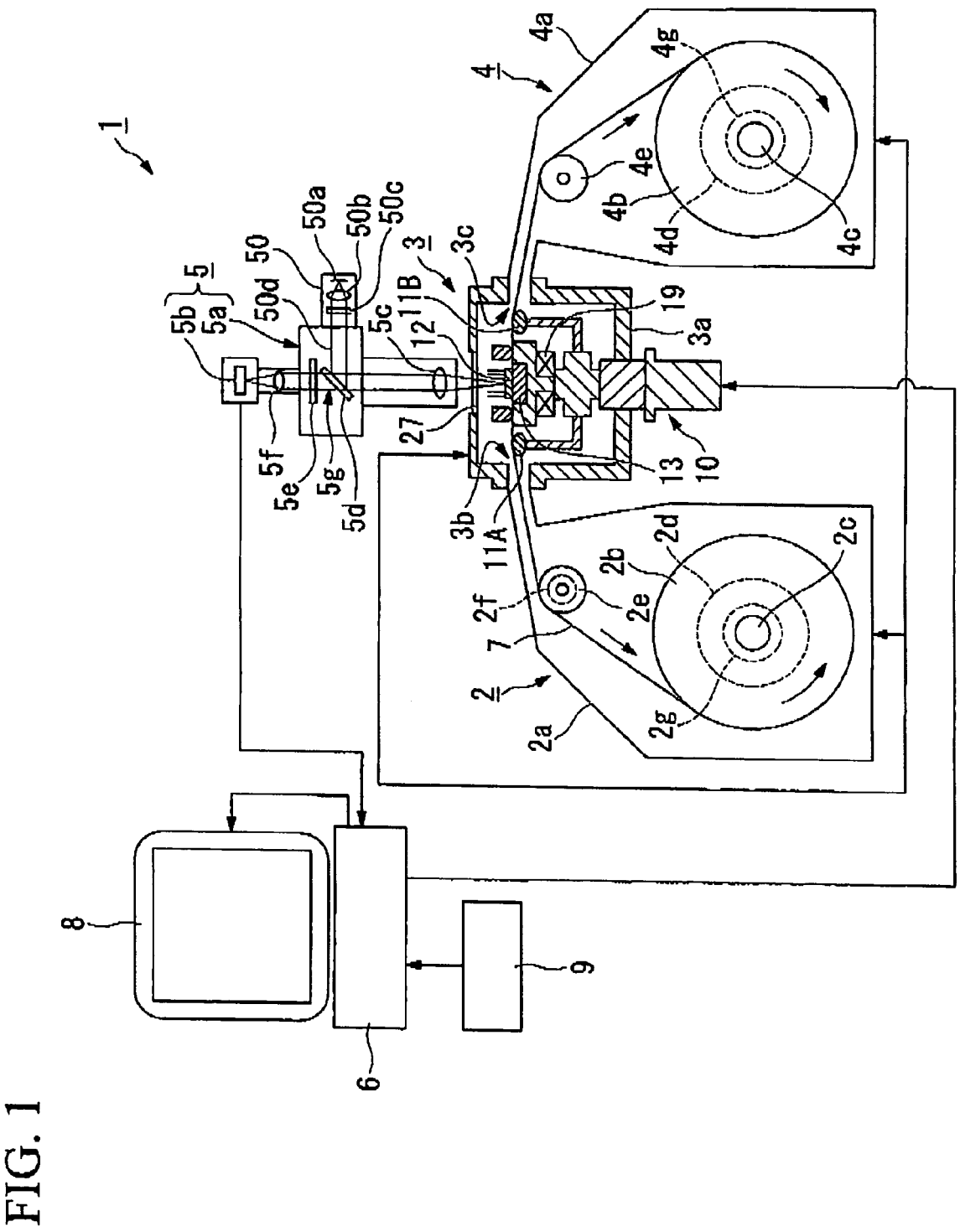
FIG. 1 is a schematic sectional view for explaining a schematic structure of continuous observation apparatus of magnetic flux distribution to an embodiment of the present invention.
Figure 2:
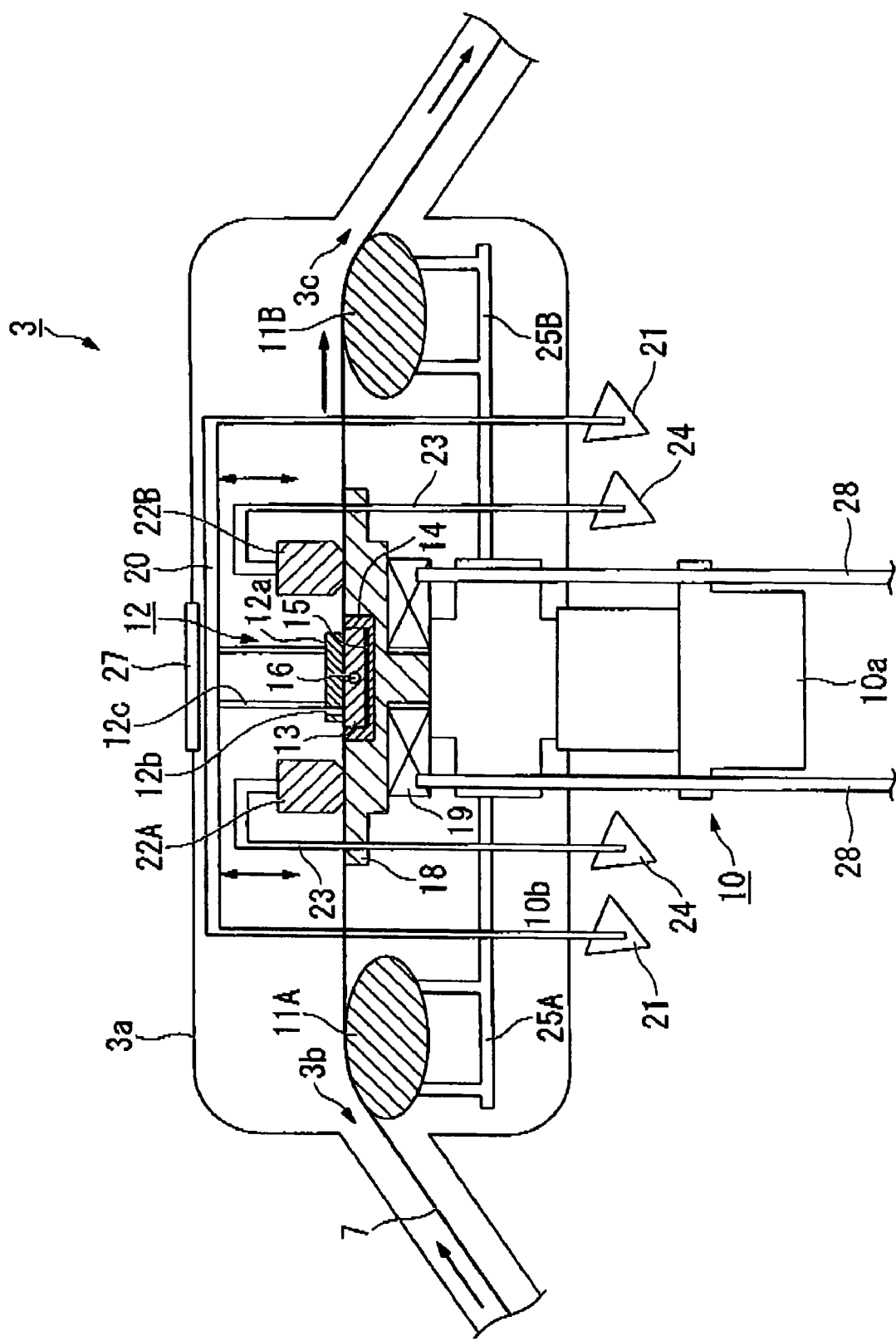
FIG. 2 is a schematic sectional view for explaining a principal part of the structure of the continuous observation apparatus of magnetic flux distribution according to the embodiment of the present invention.
Figure 3A:
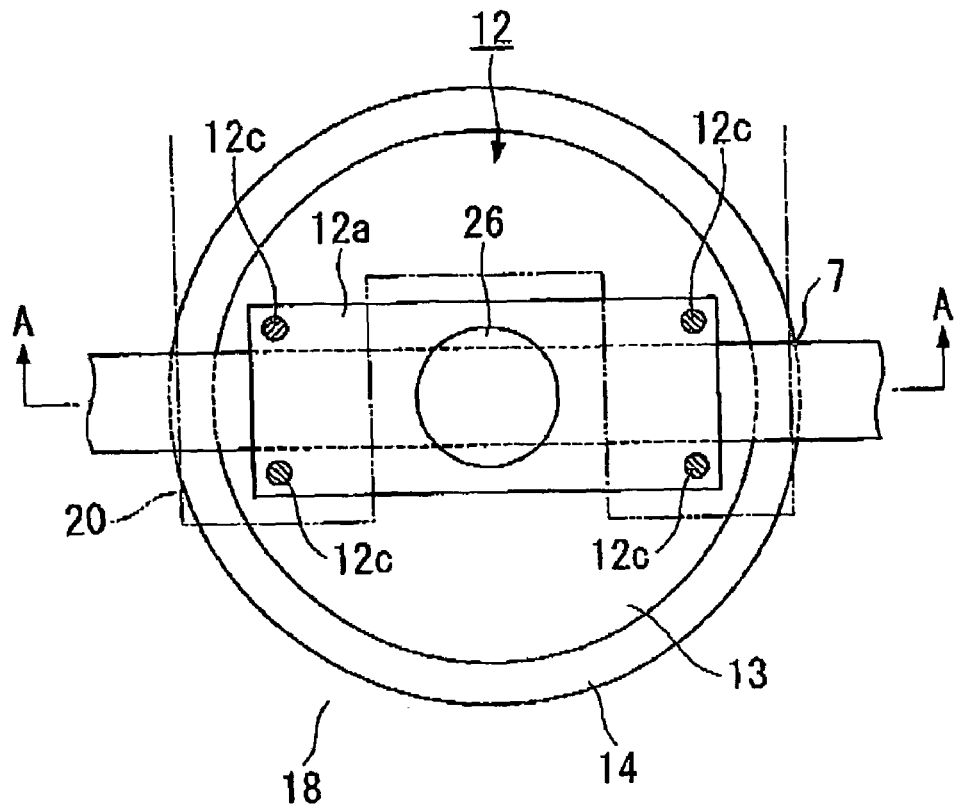
FIG. 3A is a plan view for explaining a schematic structure of a magneto-optical indicator film retaining portion used in the continuous observation apparatus of magnetic flux distribution according to the embodiment of the present invention.
Figure 3B:
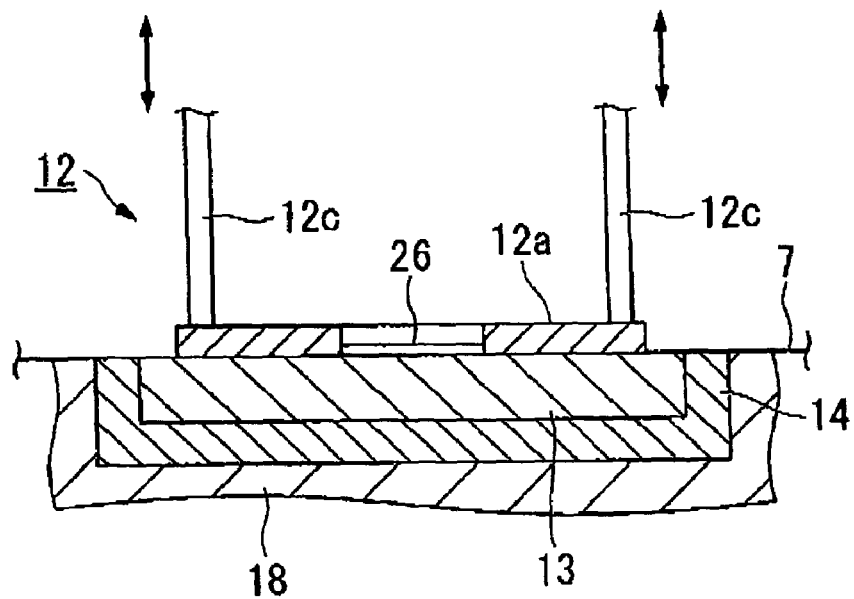
FIG. 3B is a sectional view taken along line A-A shown in FIG. 3A.
Figure 4:
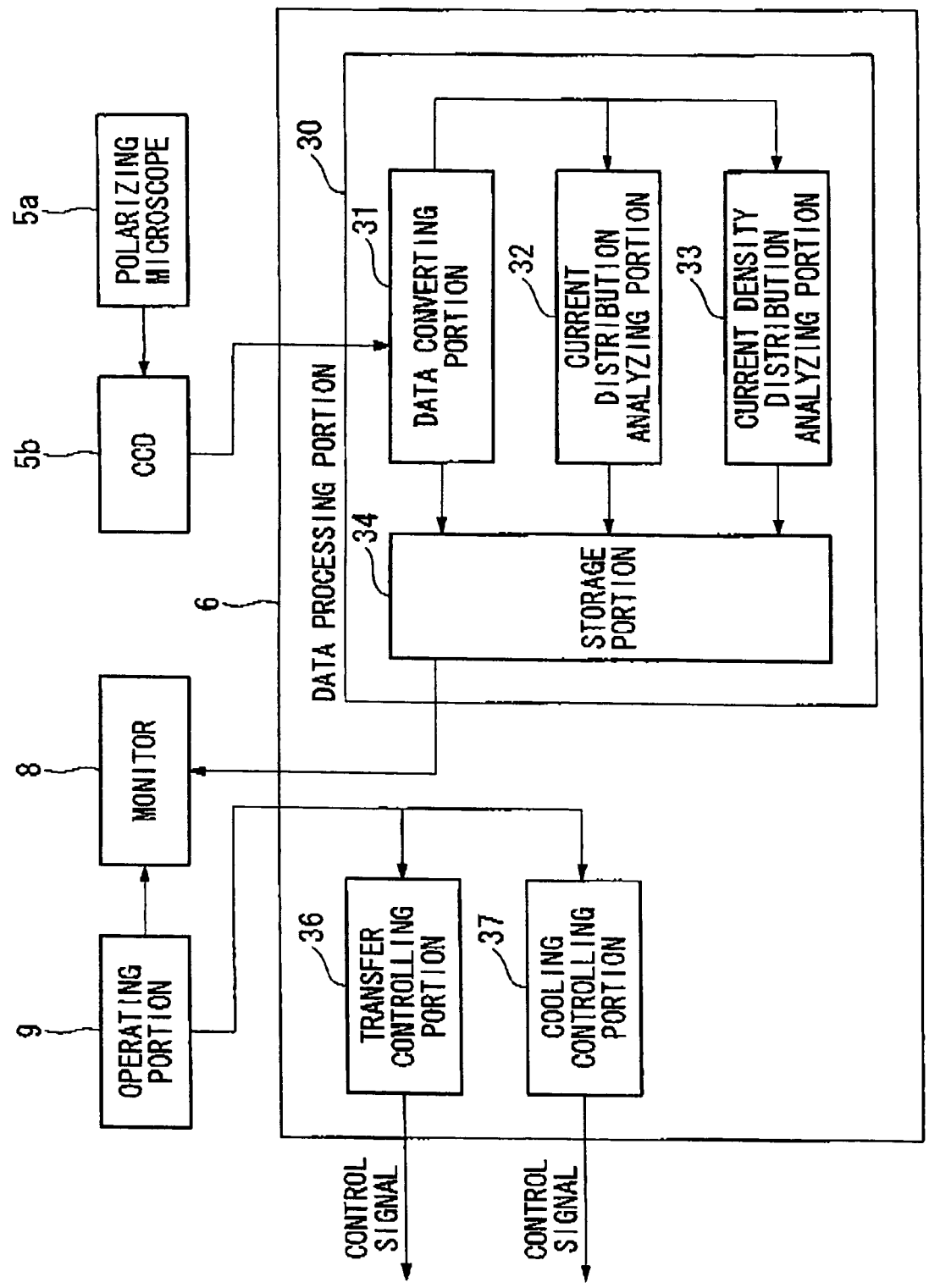
FIG. 4 is a functional block diagram for explaining a schematic structure of a control device of the continuous observation apparatus of magnetic flux distribution according to the embodiment of the present invention.

FIG. 1 is a schematic sectional view for explaining a schematic structure of the continuous observation apparatus of magnetic flux distribution according to an embodiment of the present invention. FIG. 2 is a schematic sectional view for explaining a principal part of the structure of the continuous observation apparatus of magnetic flux distribution according to the embodiment of the present invention. FIGS. 3A and 3B are respectively a plan view for explaining a schematic structure of a magneto-optical indicator film retaining portion used in the continuous observation apparatus of magnetic flux distribution according to the embodiment of the present invention and a sectional view taken along line A-A shown in FIG. 3B. FIG. 4 is a functional block diagram for explaining a schematic structure of a control device of the continuous observation apparatus of magnetic flux distribution according to the embodiment of the present invention.

In a continuous observation apparatus of magnetic flux distribution 1 of the present embodiment, a superconducting wire 7 (sample) which is made long can be observed for magnetic flux at each of certain areas along the longitudinal direction. The apparatus is preferably used in conducting a non-destructive test on defects of a long superconducting wire used in power cables, magnets and apparatuses such as motors and generators or in assessing critical current properties of these.

The superconducting tape 7 was prepared by sequentially growing the intermediate (buffer and cap) layers, a superconducting layer and a stabilized layer which are respectively several tens micrometers in thickness, for example, on a metal substrate layer having a thickness of approximately 100 µm. The superconducting wire 7 is available in a width of 10 mm or 5 mm, for example. The superconducting layer may include any appropriate second-type superconducting materials, for example, Y123 and Sm123 superconducting materials.

As illustrated in FIG. 1, the continuous observation apparatus of magnetic flux distribution 1 comprises a wire supplying portion 2, a wire reeling portion 4, a magnetic flux observing portion 3, an image capturing portion 5, an illumination optical system 50, and a control device 6.

The sample supplying portion 2 and the wire reeling portion 4 are provided on both sides of the magnetic flux observing portion 3 so as to face each other and constitute a sample transferring mechanism for transferring intermittently the superconducting wire 7 in the left direction in the drawing, with the wire inserted into the magnetic flux observing portion 3.

The wire supplying portion 2 comprises a housing 2a connected airtightly to an opening 3b on the side of the magnetic flux observing portion 3 at a tubular opening portion for allowing the superconducting wire 7 to be inserted. Also provided inside the housing is a wire reel 2b in which the superconducting wire 7 is reeled and a tension roll 2e which reels and hangs the superconducting wire 7 reeled out obliquely upward from the wire reel 2b, thereby changing the moving direction to the right direction, as illustrated in the drawing, and stretching the superconducting wire 7.

The wire reel 2b is retained by a rotational axis 2c so as to rotate around the illustrated plane's vertical axis.

A driving motor 2d for intermittently driving the superconducting wire 7 is connected via a clutch 2g for maintaining a proper tension of the superconducting wire 7 in the depth direction of the rotational axis 2c, as illustrated in the drawing. The driving motor 2d may be, for example, a pulse motor for easily controlling the speed.

Further, a rotary encoder 2f is provided on the rotational axis of the tension roll 2e and can detect the present position of the superconducting wire 7 by the control device 6 which will be described later.

The wire reeling portion 4 comprises a housing 4a connected airtightly to an opening 3c on the side of the magnetic flux observing portion 3 at the tubular opening portion for allowing the superconducting wire 7 to be inserted. Also provided inside the housing is a tension roll 4e which reels and hangs the superconducting wire 7 transferred through the magnetic flux observing portion 3 to the right side, as illustrated in the drawing, thereby changing the transfer direction to the obliquely lower direction and also stretching the superconducting wire 7 and a wire reel 4b for reeling up the superconducting wire 7 run by the tension roll 4e.

The wire reel 4b is retained by the rotational axis 4c so as to rotate around the illustrated plane's vertical axis.

A driving motor 4d for intermittently driving the superconducting wire 7 is connected via a clutch 4g for maintaining a proper tension of the superconducting wire 7 in the depth direction of the rotational axis 4c, as illustrated in the drawing. The clutch 4g and the driving motor 4d include those having the same constitution as the clutch 2g and the driving motor 2d.

The driving motors 2d and 4d are respectively connected to the control device 6 which will be described later and controlled in a mutually cooperative manner. For example, where the superconducting wire 7 is transferred from the wire supplying portion 2 to the wire reeling portion 4, the driving motor 4d switches on or off the rotation or controls the speed for intermittently transferring the superconducting wire 7, while the driving motor 2d is reversely rotated, whenever necessary, in synchronization with the timing to be slipped at a torque exceeding certain levels by the clutch 2g, whereby an appropriate back tension for stabilizing the transfer of the superconducting wire 7 is applied. Further, when the role of the driving motor 2d is reverse to that of the driving motor 4d, it is possible to transfer the superconducting wire 7 from the wire reeling portion 4 to the wire supplying portion 2 under identical conditions.

The wire reels 2b and 4b are made appropriate in outer diameter, depending on the length of the superconducting wire 7. In the present embodiment, they are 300 mm in diameter, whereby the superconducting wire 7 can be reeled up in the length of approximately 500 m.

As illustrated in FIG. 2, the magnetic flux observing portion 3 comprises a housing 3a which is kept airtight from the outside and constitutes a space insulated from the outside, except for openings connected to the wire supplying portion 2 and the wire reeling portion 4 on both sides. Also provided inside the housing is a cryo-cooler 10 (cooling apparatus), a wire cooling portion 11A (front-end cooling portion), a wire cooling portion 11B (rear-end cooling portion), a solenoid magnet 19 (magnetic field generating portion), a wire guide pressing portion 18, a wire retaining portion 13, wire pressing portions 22A and 22B and a magneto-optical (hereinafter, abbreviated as MO) film holder 12 (magneto-optical indicator film retaining portion).

A glass observation window 27 for observing the surface of the MO film holder 12 is provided on the housing 3a.

Housings 2a, 3a and 4a constitute three chambers which communicates each other. They are designed to evacuated by a vacuum pump (not illustrated) provided therein, when the apparatus is in operation.

The cryo-cooler 10 is a cooling mechanism by which the superconducting wire 7 transferred inside the magnetic flux observing portion 3 and members inside the magnetic flux observing portion 3 are subjected to conduction cooling. There is no particular restriction as to how to operate the cryo-cooler 10. In the present embodiment, a two-stage Gifford-McMahon (GM) cryo-cooler provided with an initial-stage cryo-cooler portion 10a and a second-stage cryo-cooler portion 10b is used.

Wire cooling portions 11A and 11B are members which are in contact with the superconducting wire 7 adjacent to the openings 3b and 3c, respectively, to cool the superconducting wire 7 to a fixed temperature $T_1$ and connected respectively via conduction cooling portions 25A and 25B to a second-stage cryo-cooler portion 10b. The temperature $T_1$ is set to be lower than a temperature $T_2$ at which the superconducting wire 7 is observed for magnetic flux. The present embodiment comprises a temperature difference of approximately 20K between these two temperatures. For example, $T_1$ is 20K when $T_2$ is 40K.

The wire cooling portions 11A and 11B comprise an appropriate contact area along the transfer direction of the superconducting wire 7 so as to secure a sufficient contact time, depending on the transfer speed of the superconducting wire 7. Then, in order to attain a stable contact, these portions comprise a contact position in the vertical direction on the side slightly above tension rolls 2e and 4e, brought into contact from the back surface of the superconducting wire 7 and transferred from the obliquely lower side, thereby stretching the superconducting wire 7 reeled up obliquely downward substantially in a horizontal direction between the wire cooling portions 11A and 11B. Therefore, a contact portion of the wire cooling portions 11A and 11B with the superconducting wire 7 is formed as a smoothly curved surface.

The wire cooling portions 11A and 11B may be made of any metal, as long as they are excellent in heat conductivity and sliding property with the superconducting wire 7. In the present embodiment, they are made of copper, the surface of which comprises gold by means of evaporation.

The solenoid magnet 19 is a device which generates a magnetic field in a direction perpendicular to the tape surface of the superconducting wire 7 (sample surface), and is brought into contact with the upper side of the second-stage cryo-cooler portion 10b and subjected to conduction cooling. Current leads 28 and 28 which supply an electric current to the coil portion of the solenoid magnet 19 are responsible for the heat inflow from the outside and cooled by the initial-stage cryo-cooler portion 10a outside the housing 3a.

The present embodiment is constituted so as to apply a maximum magnetic field of 100 mT. This is a magnitude of the magnetic field which allows magnetic flux to penetrate into the 10-mm wide superconducting wire 7.

The wire guide pressing portion 18 is a disk-shaped member having a smooth surface which guides in order to transfer the superconducting wire 7 run between the wire cooling portions 11A and 11B, and holds the wire in a sandwiched manner by a wire retaining portion 13 to press the wire on halt. Then, the wire guide pressing portion 18 is connected to the second-stage cryo-cooler portion 10b via the core portion of the solenoid magnet 19. As a result, the temperature is set substantially at $T_1$.

The wire guide pressing portion 18 may be made of copper, the surface of which comprises gold by means of evaporation.

A disk-shaped wire retaining portion 13 (sample cooling/retaining portion), the upper surface of which is arranged flush with the wire guide pressing portion 18, is filled via a heat insulating layer 14 into the central portion of the wire guide pressing portion 18 corresponding to the upper portion at the core portion of the solenoid magnet 19.

Wire pressing portions 22A and 22B, which move up and down in synchronization with the transfer and halting of the superconducting wire 7, holding the superconducting wire 7 between the wire retaining portion 13 and the pressing portions 22A and 22B and pressing it on descent, are provided on the wire guide pressing portion 18 between the wire retaining portion 13 and the wire cooling portions 11A and 11B.

The wire pressing portions 22A and 22B are respectively moved up and down by an elevating arm 23 which is moved up and down by an elevating mechanism 24.

The elevating mechanism 24 may be, for example, a cam connected to a motor (not illustrated) which is controlled by a control device 6 which will be described later.

Further, although not illustrated in particular, the wire pressing portions 22A and 22B and the elevating arm 23 are cooled to a temperature similar to that at the wire guide pressing portion 18 by an appropriate thermal anchor.

The wire retaining portion 13 is a member for retaining the superconducting wire 7 at a fixed temperature $T_2$ at least in an observation position provided at a certain area at the center of the magnetic field by the solenoid magnet 19.

Since the temperature $T_2$ is higher than the temperature at the wire guide pressing portion 18 which is adjacent via a heat insulating layer 14, a heater 15 controlled intermittently by the control device 6 is embedded between the wire retaining portion 13 and the heat insulating layer 14 as a temperature elevating device for retaining the temperature $T_2$. A temperature-controlling thermo-sensor 16 used in controlling the temperature by the control device 6 is arranged inside the wire retaining portion 13.

The wire retaining portion 13 is adjacent to the wire guide pressing portion 18 lower in temperature and inclined to decrease in temperature toward the periphery from the center, although via the heat insulating layer 14. It is, therefore, preferable that the wire retaining portion 13 be more than 3 times longer in the transfer direction than the width of an observation area so that an adjacent observation area can be retained on the wire retaining portion 13.

The wires retaining portion 13 may be made of copper, the surface of which comprises gold by means of evaporation.

The beat insulating layer 14 is provided in order to control heat conduction to the wire guide pressing portion 18 thermally connected to the second-stage cryo-cooler portion 10b and facilitate the temperature control of the wire retaining portion 13. The heat insulating layer 14 may be made, for example, of non-magnetic stainless steel.

As illustrated in FIG. 3A and FIG. 3B, the MO film holder 12 is a member for retaining a MO film 26 and attaching to or detaching from the superconducting wire 7 transferred onto the wire retaining portion 13 in synchronization with the transferring actions. In the present embodiment, a circular hole is formed at the center of a rectangular retaining plate 12a which is shorter than an outer diameter of the wire retaining portion 13 and slightly larger than the width of the superconducting wire 7 to fix the MO film 26, and four corners of the retaining plate 12a are supported by using four supporting arms 12c in a manner movable up and down from above. Thus, the MO film 26 is pressed at an appropriate pressure to the superconducting wire 7 on the wire retaining portion 13, thereby making it possible to firmly attach the MO film 26 to the surface of the superconducting wire 7. It is, therefore, possible to make an accurate measurement of the magnetic field on the surface of the superconducting wire 7.

Although not illustrated in particular, the MO film holder 12 is thermally connected by a thermal anchor to the wire retaining portion 13 and kept at a temperature close to the temperature $T_2$ and can promptly equilibrate with the temperature $T_2$ on contact with the superconducting wire 7 and the wire retaining portion 13.

The MO film holder 13 may be made of copper, the surface of which comprises gold by means of evaporation.

The supporting arm 12c is connected at the upper part thereof to an elevating arm 20 (refer to FIG. 2) which is moved up and down by an elevating mechanism 21. The elevating mechanism 21 may include a mechanism similar to the elevating mechanism 24.

As illustrated in FIG. 3A, the elevating arm 20 is provided above the MO film holder 12 with a cutout large enough to observe the MO film 26 from above.

The MO film 26 is for observing the magnetic flux penetrated into the superconducting wire 7 transferred to an observation position, by utilizing magneto-optical effects. In the present embodiment, an outer configuration is formed in a circular shape into which a rectangular observation area on the superconducting wire 7 is included and comprises a reflective layer, a magnetic film layer and a transparent substrate layer from the side contacting with the superconducting wire 7 in the thickness direction.

Therefore, when polarized light enters into the MO film 26, the polarization direction is rotated by the Faraday effect, depending on magnetization of the magnetic film layer of the MO film 26. On return after reflection on the reflective layer, the polarization direction is further rotated, thereby providing reflected light, the polarization direction of which is greatly rotated, depending on the magnetic flux density distribution.

Thus, the magnetic flux density distribution is observed as a polarization distribution.

Materials for forming a magnetic film layer may include any in-plane magnetized magnetic film having an axis of easy magnetization inside the plane, for example, a Bi-substituted magnetic garnet film. Specific materials may be any one of those disclosed, for example, in the Japanese Journal of Applied Physics, Vol. 44, No. 4A, pp. 1734-1739, 2005. Further, a paramagnetic film free of an axis of easy magnetization may be used as the magnetic film layer. For example, Eu chalcogenides such as EuS, EuSe and EuO may be used.

In the in-plane magnetized magnetic film and the paramagnetic film, since the resolution is equal to a minimum unit of magnetization, they comprise a much higher resolution than a perpendicular magnetic film which is restricted in resolution by the magnitude of the magnetic domain.

As illustrated in FIG. 1, the image capturing portion 5 is arranged above an observation window 27 of the magnetic flux observing portion 3 and comprises a polarizing microscope 5a which is to observe via the observation window 27 polarization of the reflected light 5g obtained by irradiating linearly-polarized light on the MO film 26 and a CCD 5b which is to obtain data on luminance distribution by capturing an image observed by the polarizing microscope 5a.

The illumination optical system 50 is means for supplying linearly-polarized illumination light 50d to the polarizing microscope 5a by condensing a light source 50a comprising a white light source through a condenser lens 50b and allowing the same to pass through a polarizer 50c, and is provided on the side of the polarizing microscope 5a.

Since the polarizing microscope 5a is arranged outside the magnetic flux observing portion 3, any type of polarizing microscope may be used, as long as it comprises a field capable of observing a scope covering the observation area and a focal length which allows the microscope to be arranged distant from at least a distance from the MO film 26 to the observation window 27. For example, a microscope with an objective lens 5c and an image taking lens 5f is usable, in which illumination light 50d is entered into the objective lens 5c on the light path between these lenses and guided on the MO film 26, the microscope including a beam splitter 5d for allowing the reflected light 5g from the MO film 26 to pass through and a polarizer 5e for converting the polarization distribution of the reflected light 5g to the contrast corresponding to the magnetic flux density distribution.

The CCD 5b is a CCD with an appropriate pixel size, which may be selected depending on a required resolution. In the present embodiment, for example, data can be obtained such that an observation area is 2000×2000 pixels and 12 bits are given for each pixel.

The CCD 5b is connected to a control device 6 to send data on luminance distribution to the control device 6.

As illustrated in FIG. 4, the control device 6 comprises a data processing portion 30, a transfer controlling portion 36, and a cooling controlling portion 37. They may be available as a combination of hardware or individually available as an independent component. In the present embodiment, a program is used such that the function of each component is loaded into a computer.

The data processing portion 30 comprises a data converting portion 31 for converting the data on luminance distribution sent from the CCD 5b to the magnetic flux density distribution depending on the Faraday effect properties of the MO film 26, a current distribution analyzing portion 32 for calculating an equal current distribution from the magnetic flux density distribution obtained by the data converting portion 31, a current density distribution analyzing portion 33 for calculating the critical current density distribution from the magnetic flux density distribution obtained by the data converting portion 31, and a storage portion 34 for storing these data.

Data stored into the storage portion 34 are to be displayed on a monitor 8 in a state such that they are processed into images or graphs.

The transfer controlling portion 36 is connected to driving motors 2d and 4d, clutches 2g and 4g, elevating mechanisms 24 and 21, a solenoid magnet 19 and others, giving cooperative control to them, transferring intermittently a superconducting wire 7 to transfer the superconducting wire 7 to an observation position by a certain width, and applying a certain magnetic field to the solenoid magnet 19 at a predetermined timing, thereby making an observation of magnetic flux. A rotary encoder 2f is used to detect a current position of the superconducting wire 7.

The cooling controlling portion 37 is to give a temperature setting respectively to an initial-stage cryo-cooler portion 10a and a second-stage cryo-cooler portion 10b of the cryo-cooler 10, setting the wire cooling portions 11A and 11B at the temperature $T_1$, and controlling the wire retaining portion 13 at the temperature $T_2$ depending on the output of the temperature-controlling thermo-sensor 16.

It is to be noted that an operation of inputting set values in the transfer controlling portion 36 and the cooling controlling portion 37 is performed by an operating portion 9 such as a keyboard, which is connected to the control device 6.

Next, an explanation will be made of the motion of the continuous observation apparatus of magnetic flux distribution 1 according to the present embodiment by mainly referring to procedures for observing a magnetic field.

Figure 5:
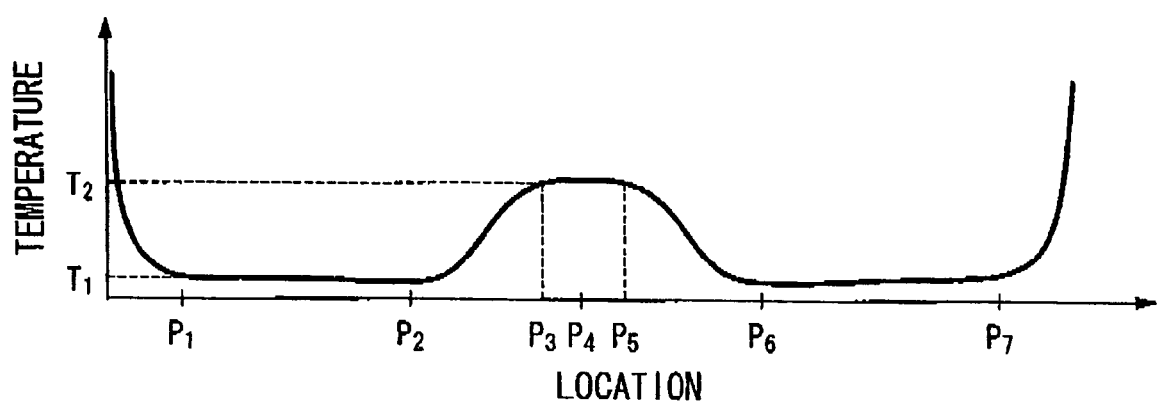
FIG. 5 is a schematic graph for explaining the temperature distribution of a sample in the vicinity of an observation position in the continuous observation apparatus of magnetic flux distribution according to the embodiment of the present invention.

FIG. 5 is a schematic graph for explaining the temperature distribution of a sample in the vicinity of an observation position in the continuous observation apparatus of magnetic flux distribution according to an embodiment of the present invention. The abscissa represents a position in the sample in the longitudinal direction, while the ordinate represents temperatures of the sample. FIGS. 6A-6F show output samples illustrating observation examples of the continuous observation apparatus of magnetic flux distribution according to the embodiment of the present invention. FIG. 7A shows an output sample for explaining a continuous observation example taken along the longitudinal direction of a sample placed on the continuous observation apparatus of magnetic flux distribution according to the embodiment of the present invention. FIG. 7B shows an output sample of a comparative example obtained by measuring the same sample as that illustrated in FIG. 7A, according to the hall element array method.

Observations of magnetic flux by using the continuous observation apparatus of magnetic flux distribution 1 include those of magnetic flux density distribution, equal current distribution and critical current density distribution Jc by allowing the magnetic flux density of the magnetic field in the direction perpendicularly penetrating the superconducting wire 7 to change, with temperatures of the superconducting wire 7 kept constant, thereby observing a state of the magnetic flux penetrated into the superconducting wire 7, for example, in order to check a position of the defect of the superconducting wire 7 or examine properties of critical current.

If the superconducting wire 7 is a normal second-class superconducting material, the magnetic field is removed at a temperature lower than the critical temperature, and the magnetic flux is, therefore, unable to penetrate therethrough. As a result, the magnetic flux density distribution will increase at the across-the-width end of the superconducting wire 7, and the magnetic flux will penetrate little by little from both ends with an increase in magnetic flux density of the magnetic field to be applied. However, when the superconducting wire 7 has a defect therein, the magnetic flux is more likely to penetrate therein from a site of the defect, thereby affecting the equal current distribution or the critical current density distribution.

In the above-described assessment of defects, even a defect of about 10 μm may pose a problem. It is, therefore, preferable to observe defects at a resolution lower than 1 μm.

First, as illustrated in FIG. 1, the superconducting wire 7 reeled out from a wire reel 2b is set by being reeled and hung over a wire reel 4b in a state such that it is run at a certain tension by using a tension roll 2e, wire cooling portions 11A and 11B and a tension roll 4e. Here, the superconducting wire 7 is made movable horizontally on the wire guide pressing portion 18 and the wire retaining portion 13 between the wire cooling portions 11A and 11B.

On the contrary, the cooling controlling portion 37 is to set the respective cooling temperatures at an initial-stage cryo-cooler portion 10a and a second-stage cryo-cooler portion 10b. A heater 15 is also actuated.

Thereby, wire cooling portions 11A and 11B, a solenoid magnet 19 and a wire guide pressing portion 18 are set at the temperature $T_1$, and a wire retaining portion 13 is set at the temperature $T_2$. Conditions are provided such that, for example, $T_1=20K$ and $T_2=40K$.

Therefore, the wire cooling portions 11A and 11B act to cool the superconducting wire 7 down to the temperature $T_1$, and even when heat is transmitted from the superconducting wire 7 placed at the wire supplying portion 2 or the wire reeling portion 4, which is relatively higher in temperature, the heat is blocked by the wire cooling portions 11A and 11B, thus making it possible to cut off the influence of external temperatures. Thus, there is an advantage in that a long superconducting wire 7 housed inside the wire supplying portion 2 or the wire reeling portion 4 is not required to be cooled to temperatures on observation as a whole and the temperature to be maintained.

If no heating is provided from the heater 15, the superconducting wire 7 between the wire cooling portions 11A and 11B will soon reach a thermal equilibrium and reach the temperature $T_1$.

Next, the transfer controlling portion 36 is used to drive driving motors 2d and 4d, thereby reeling the superconducting wire 7 around the wire reel 4b and transferring an initial observation area of the superconducting wire 7 to the observation position. Here, the wire cooling portion 11A and the superconducting wire 7 comprise a contact area which will attain the thermal equilibrium within the transfer time, and therefore, the superconducting wire 7 transferred to the magnetic flux observing portion 3 reaches the temperature $T_1$.

Further, the transfer controlling portion 36 drives elevating mechanisms 24 and 21 to lower respectively wire pressing portions 22A and 22B and a MO film holder 12, holding the superconducting wire 7 between the wire guide pressing portion 18 and the wire retaining portion 13.

Here, the wire pressing portions 22A and 22B and the MO film holder 12 inhibit the movement in the transfer direction and also press the superconducting wire 7, whenever necessary. As a result, the superconducting wire 7 is held between the wire retaining portion 13 and the MO film 26 so as to be firmly sandwiched between these, the back of the superconducting wire 7 is firmly attached to the wire guide pressing portion 18 and the wire retaining portion 13, and the surface of the superconducting wire 7 is firmly attached to the retaining plate 12a and the MO film 26. As a result, the Faraday effect resulting from the surface magnetic field can be accurately observed by using the MO film 26. Further, thermal equilibrium is immediately attained between the respective members.

FIG. 5 schematically illustrates the temperature distribution of the superconducting wire 7 observed in this instance. Areas $P_1P_2$ and $P_6P_7$ illustrated in the drawing correspond to contact areas with the wire cooling portions 11A and 11B respectively, while area $P_3P_5$ corresponds to the center portion of the wire retaining portion 13 including an observation area. Point $P_4$ represents the center of the observation position.

More specifically, outside the points $P_1$ and $P_7$, the inner temperature is abruptly decreased to the temperature $T_1$ respectively at the wire supplying portion 2 and the wire reeling portion 4, and the temperature $T_1$ is given at areas $P_1P_2$ and $P_6P_7$ between which, the temperature $T_2$ is given at area $P_3P_5$ to form a mountain-shaped temperature elevating area.

The solenoid magnet 19 is used to apply a magnetic field, with this state kept. The magnetic field is applied at an observation area in the direction perpendicular to the tape surface of the superconducting wire 7.

Since the observation position of the superconducting wire 7 is arranged across the wire retaining portion 13 or the wire guide pressing portion 18, and distant from the end of the solenoid magnet 19 to the outside of the solenoid magnet 19, the magnetic flux density depending on a distance from the coil portion of the solenoid magnet 19 is attenuated according to the distance apart.

For example, on the assumption that the solenoid magnet 19 is made hollow and the superconducting wire 7 is transferred so as to move across the magnetic field inside the coil portion, the magnetic flux density will be minimized at the center of the hollow portion and will increase radially toward the outside. Here, the superconducting wire 7 is subjected to a strong magnetic field outside an observation area and the magnetic field remains. Then, the remaining magnetic flux density is found when the superconducting wire 7 is transferred to an observation position, thus resulting in a failure in correctly detecting critical current properties.

In contrast, according to the arrangement of the present embodiment, the magnetic flux density tends to be maximized on the central axis of the coil portion and undergoes attenuation radially toward the outside. Therefore, a distance apart toward above is appropriately set to provide a magnetic flux density distribution which is maximum in magnetic flux density inside the observation area and flat in a radial direction (horizontal direction). Further, since the wire cooling portion 11A is also distant toward the outside from the radial end of the solenoid magnet 19, the superconducting wire 7 is transferred without passage through a magnetic field greater than that found at the observation position even on the transfer path from the wire cooling portion 11A to the observation position.

Further, even if the magnetic flux density is flat in the transfer direction, where the temperature of the superconducting wire 7 is higher than that of the observation position outside the observation area, a second-class superconducting material is inferior in removing magnetic flux and, therefore, the magnetic flux is more likely to penetrate therein. Owning to this reason, another measurement is made while an external magnetic field at the observation area penetrates into the superconducting wire 7 and remains therein, thereby making it difficult to calculate critical current properties on the basis of the zero magnetic field cooling.

In the present embodiment, since wire cooling portions 11A and 11B, the wire guide pressing portion 18 and others are used to provide the temperature $T_1$ lower than the temperature $T_2$ to the superconducting wire 7 at a wider range inside the magnetic flux observing portion 3 to which the magnetic field is applied, there is an advantage of eliminating the influence of magnetic field cooling.

When a magnetic field is applied to the superconducting wire 7 at a fixed temperature $T_2$, some magnetic flux will penetrate into a sample, without being removed, due to the magnitude of the magnetic field or the presence of defects.

When the magnetization of the MO film 26 is canted by the magnetic flux to irradiate linearly-polarized light, the Faraday effect is provided. Namely, depending on the rotation in the magnetization direction corresponding to the magnetic flux density, the polarization direction of polarized light will rotate only by two times the angle, reflecting the non-reciprocity of the Faraday effect. Therefore, observation by a polarizing microscope 5a provides an image having the luminance distribution in accordance with the degree of the magnetic flux density.

The image is taken by using a CCD 5b, and data on luminance distribution according to the luminance level is sent to the data processing portion 30.

When imaging is completed, application of the magnetic field by the solenoid magnet 19 is halted, and wire pressing portions 22A and 22B and a MO film holder 12 are elevated to make the MO film 26 distant above a superconducting wire 7, thereby transferring the superconducting wire 7 to an adjacent observation area. Then, the above process is repeated.

Here, the superconducting wire 7 at the adjacent observation area is, as illustrated in FIG. 5, kept at a temperature slightly lower than the temperature $T_2$ and at least higher than the temperature $T_1$. Therefore, in the following processes, the time required for reaching temperature equilibrium after the MO film holder 12 is lowered is extremely short and substantially constant at each of the observation areas. As a result, thermal conditions vary to a smaller extent even when an intermittent measurement is made, and therefore, a continuous measurement can be followed sequentially.

In the present embodiment, a temperature stabilizing time at an observation area, namely, a measurement time interval has reached 10 s/cm. More specifically, when the width L of measurement area in the transfer direction is 10 mm, time required for reaching the temperature equilibrium is 10 s.

Next, a brief explanation will be made of motions of the data processing portion 30.

Data on luminance distribution sent out to the data converting portion 31 are trimmed to the dimensions of an observation area and subjected to data conversion on the basis of the relative relationship of previously stored luminance with the magnetic flux density (calibration data). More specifically, luminance data read by the CCD 5b are converted to magnetic flux density data at a ratio of 1 to 1.

Therefore, an observation area with the dimensions of 10 mm×10 mm is taken as an image having 2000×2000 pixels and 12 bits, thereby providing a resolution whose unit is 0.5 μm.

Figure 6A:
FIGS. 6A-6F show output samples illustrating observation examples of the continuous observation apparatus of magnetic flux distribution according to the embodiment of the present invention.
Figure 6B:
Figure 6C:
Figure 7A:
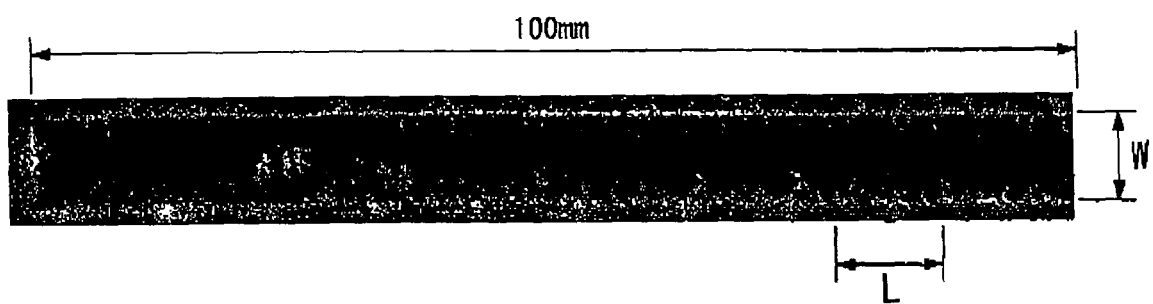
FIG. 7A shows an output sample for explaining a continuous observation example taken along the longitudinal direction of a sample placed on the continuous observation apparatus of magnetic flux distribution according to the embodiment of the present invention.
Figure 7B:
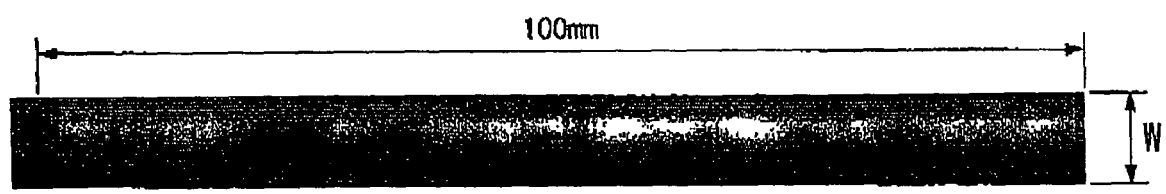
FIG. 7B shows an output sample of a comparative example obtained by measuring the same sample according to the Hall sensor devices array method.

FIG. 6A and FIG. 6B show output samples of data on luminance distribution having the respective magnetic flux densities of 20 mT and 50 mT. Further, FIG. 6C shows an output sample of luminance distribution data in a remaining state of the magnetic flux when application of the magnetic field is halted from a state given in FIG. 6B. The symbol W in the drawing represents a width of the superconducting wire 7.

It is apparent from either of FIG. 6A or FIG. 6B that a high luminance part is observed at an intermediate portion. Further, according to FIG. 6C, a high luminance part appears at the same site in a remaining state as well.

At the current distribution analyzing portion 32, magnetic flux density data sent from the data converting portion 31 are converted to electric current values on the basis of the Biot-Savart Law, Kirchhoff's Law and others, by which an equal current distribution is calculated. This calculation is made by using fast Fourier transform (FFT) at a wave-number space to reduce a processing time, thereby making it possible to observe graphs such as FIGS. 6D, 6E, and 6F on a monitor 8.

Figure 6D:
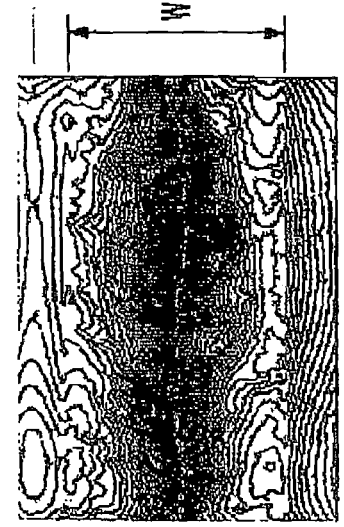
Figure 6E:
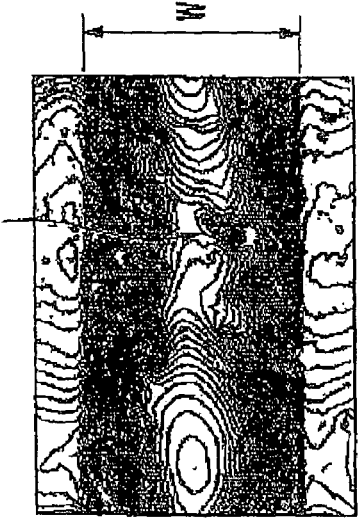
Figure 6F:
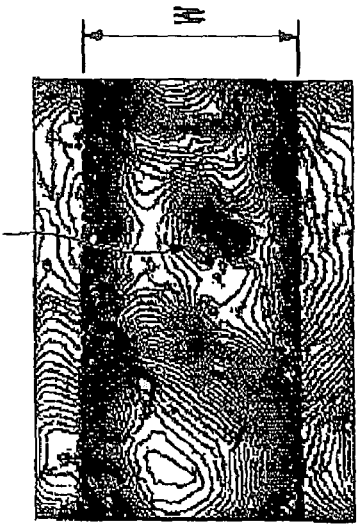

FIGS. 6D, 6E, and 6F show equal current distributions calculated from the data given respectively in FIGS. 6A, 6B and 6C. It is, then, apparent that the above-described high luminance part shows a unique distribution as current distribution, as with the B part.

At the current density distribution analyzing portion 33, magnetic flux density data sent from the data converting portion 31 are subjected to calculation on the basis of a previously established critical current model and Maxwell's equations.

According to the continuous observation apparatus of magnetic flux distribution 1 of the present embodiment, as illustrated in FIGS. 6A-6F, not only are data on a particular observation area obtained in detail but also the data can be obtained continuously along the transfer direction of the superconducting wire 7, thereby making it possible to conduct a test for detecting defects along the entire line length of the superconducting wire 7 on a real-time basis. For example, the apparatus may be used as an assessment apparatus by which threshold values for detecting an abnormality are set to the magnetic flux density distribution, equal current distribution and critical current density distribution, acceptance of the test results is judged by referring to the data obtained and calculation results, and unaccepted test results are recorded.

FIG. 7A shows one example of a long output sample only for a part of 100 mm measured from the leading end (the left side in the drawing). The sample was measured under the conditions of $T_2=40K$ and the magnetic flux density=50 mT.

Clearly found at the leading end portion of the sample is an abnormal part which is greater in penetration of magnetic flux. It is, however, quite apparent that the magnetic flux has penetrated substantially up to only a certain area from the end on the left side in the drawing.

In contrast, FIG. 7B shows a comparative example obtained by measuring the same sample according to the hall element array method.

In the output sample, an area into which the magnetic flux penetrates is represented by a low luminance which is reverse to that given in FIG. 7A. The sample was measured under the conditions of $T_1=77K$ and the magnetic flux density=20 mT.

This case clearly shows that the resolution is low and therefore minute changes observed in FIG. 7A are averaged.

As described so far, according to the continuous observation apparatus of magnetic flux distribution 1 of the present embodiment, a certain range of area is subjected to temperature control to a fixed temperature $T_2$ at an observation position on the wire retaining portion 13, thereby reducing a temperature difference with respect to the temperature $T_2$ at an adjacent certain area transferred intermittently, and attaining temperature equilibrium at a shorter time at each of the certain areas. Therefore, even a long sample may be measured sequentially and efficiently.

In the above description, an explanation was made on the basis of $T_2>T_1$. However, a case of $T_2=T_1$ may be acceptable where before reaching an observation position, the superconducting wire 7 will not pass through the magnetic field which is greater than that at the observation position, during which the temperature of the superconducting wire 7 will not exceed the temperature $T_2$.

Further, in the above description, an explanation was made of a case where the wire cooling portions 11A and 11B were respectively at the temperature $T_1$. However, the wire cooling portions 11A and 11B may be different in temperature, as long as the temperature is lower than the temperature $T_2$. More specifically, the wire cooling portion 11A may be at the temperature $T_1$ and the wire cooling portion 11B may be at the temperature $T_3$ (however, $T_3<T_2$). Here, a sample is kept at a first temperature of $T_1$ on the upstream side of the observation position, at a second temperature of $T_2$ at the observation position and at a third temperature of $T_3$ on the downstream side of the observation position.

Further, in the above description, an explanation was made of a case where the data processing portion 30 was used to calculate the magnetic flux density data. However, the data processing portion 30 may not be required in a case where the density distribution of magnetic flux is observed visually by referring to the contrasting density of an image obtained by a polarizing microscope 5a.

Still further, in the above description, an explanation was made of a case where the cryo-cooler 10 for effecting conduction cooling was used as a cooling mechanism. However, a mechanism in which freezing mixtures are used in a cooling source may be used as long as a final cooling portion is subjected to conduction cooling.

In addition, in the above description, an explanation was made of a case where the superconducting wire 7 was transferred from the wire supplying portion 2 to the wire reeling portion 4. However, the superconducting wire 7 may be transferred from the wire reeling portion 4 to the wire supplying portion 2, whenever necessary. Here, the front-end cooling portion and the rear-end cooling portion respectively serve as the wire cooling portions 11B and 11A.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A continuous observation apparatus of magnetic flux distribution in which a long sample containing a superconducting material is transferred to an observation position and magnetic flux is observed sequentially at each of certain areas along a longitudinal direction of the sample, comprising:
   a sample transferring device for intermittently transferring the sample to the observation position;
   a sample cooling/retaining portion for adjusting the sample transferred to the observation position to a fixed temperature and retaining said temperature;
   a magnetic field generating portion for generating the magnetic field in a direction perpendicular to the sample surface at the observation position;
   a magneto-optical indicator film which converts magnetic flux density distribution to polarization distribution of reflected light by magneto-optical effects;
   a magneto-optical indicator film retaining portion at which the magneto-optical indicator film is synchronized with the transferring action by the sample transferring device so as to be detachable from the surface of the sample;
   an illumination optical system for irradiating linearly-polarized light to the magneto-optical indicator film;
   a polarization observing device for observing the polarization distribution of reflected light of the light irradiated to the magneto-optical indicator film by the illumination optical system; and
   a cooling mechanism for controlling temperatures at the sample cooling/retaining portion, thereby providing the sample with the fixed temperature at the observation position.

2. The continuous observation apparatus of magnetic flux distribution as set forth in claim 1, wherein the cooling mechanism comprises a front-end cooling portion and a rear-end cooling portion at an upstream side and a downstream side in the transfer direction with respect to the sample cooling/retaining portion for respectively cooling the sample to temperatures lower than the fixed temperature.

3. The continuous observation apparatus of magnetic flux distribution as set forth in claim 1, wherein the polarization observing device comprises:
   an image capturing portion for imaging as luminance distribution the polarization distribution on the magneto-optical indicator film; and
   a data converting portion for converting luminance distribution data obtained by the image capturing portion to data on the magnetic flux density distribution.

4. The continuous observation apparatus of magnetic flux distribution as set forth in claim 1, wherein a current distribution property is calculated with reference to data on the magnetic flux density distribution obtained by a data converting portion.

5. The continuous observation apparatus of magnetic flux distribution as set forth in claim 1, wherein
   the magnetic field generating portion comprises a solenoid magnet, the center of the observation position of the sample is on the central axis of the magnetic field of the solenoid magnet and arranged distant from the end of the solenoid magnet, and a front-end cooling portion is arranged distant toward the outside from the radial end of the solenoid magnet.

6. The continuous observation apparatus of magnetic flux distribution as set forth in claim 1, wherein a front-end cooling portion, a rear-end cooling portion, and the sample cooling/retaining portion are subjected to conduction cooling by the cooling mechanism.

7. The continuous observation apparatus of magnetic flux distribution as set forth in claim 1, wherein the magneto-optical indicator film is an in-plane magnetized magneto-optical indicator film having an axis of easy magnetization inside the plane of the film.

8. The continuous observation apparatus of magnetic flux distribution as set forth in claim 1, wherein the magneto-optical indicator film is a paramagnetic magneto-optical indicator film free of an axis of easy magnetization.

9. A method of continuously observing magnetic flux by which a long sample containing a superconducting material is transferred to an observation position and magnetic flux is observed sequentially at each of certain areas along a longitudinal direction of the sample, comprising:

cooling the sample to a first temperature on an upstream side of the observation position;

allowing a magnetic field to act on the perpendicular direction of the sample surface in a state such that the sample transferred to the observation position is elevated to a second temperature, which is higher than the first temperature;

observing an image of magnetic flux density distribution on the surface of the sample by means of a magneto-optical indicator film which converts magnetic flux density distribution to polarization distribution of reflected light by magneto-optical effects; and cooling the sample to a third temperature which is lower than the second temperature on a downstream side of the observation position and then transferring the sample further downstream.

10. A method of continuously observing magnetic flux as set forth in claim 9, wherein the magneto-optical indicator film is an in-plane magnetized magneto-optical indicator film having an axis of easy magnetization inside the plane of the film.

11. A method of continuously observing magnetic flux as set forth in claim 9, wherein the magneto-optical indicator film is a paramagnetic magneto-optical indicator film free of an axis of easy magnetization.

* * * * *